(12) United States Patent
Hu

(10) Patent No.: US 7,274,671 B2
(45) Date of Patent: Sep. 25, 2007

(54) BITWISE ADAPTIVE ENCODING USING PREFIX PREDICTION

(75) Inventor: Xiaoping Hu, San Jose, CA (US)

(73) Assignee: Boly Media Communications, Inc., Cupertino, CA (US)

( * ) Notice: Subject to any disclaimer, the term of this patent is extended or adjusted under 35 U.S.C. 154(b) by 450 days.

(21) Appl. No.: 09/780,912

(22) Filed: Feb. 9, 2001

(65) Prior Publication Data

US 2002/0141422 A1    Oct. 3, 2002

(51) Int. Cl.
*H04L 12/28* (2006.01)
*H04L 12/56* (2006.01)

(52) U.S. Cl. .................. 370/256; 370/400; 370/408; 341/65; 341/67; 341/107; 709/247

(58) Field of Classification Search ............. 370/408, 370/441, 400, 255, 256, 521; 710/65, 68, 710/67; 345/202; 395/114; 358/420; 379/88.1, 379/93.08; 341/56–67, 107
See application file for complete search history.

(56) References Cited

U.S. PATENT DOCUMENTS

| | | | | |
|---|---|---|---|---|
| 3,716,851 A | * | 2/1973 | Neumann | 341/67 |
| 4,168,513 A | * | 9/1979 | Hains et al. | 382/244 |
| 4,500,955 A | * | 2/1985 | Chang | 710/68 |
| 4,646,061 A | * | 2/1987 | Bledsoe | 341/65 |
| 5,270,712 A | * | 12/1993 | Iyer et al. | 341/50 |
| 5,796,356 A | * | 8/1998 | Okada et al. | 341/51 |
| 5,801,648 A | * | 9/1998 | Satoh et al. | 341/50 |
| 5,844,508 A | * | 12/1998 | Murashita et al. | 341/51 |
| 5,973,626 A | * | 10/1999 | Berger et al. | 341/65 |
| 6,061,398 A | * | 5/2000 | Satoh et al. | 375/240 |

(Continued)

FOREIGN PATENT DOCUMENTS

EP    0 079 442 A2    5/1983

(Continued)

OTHER PUBLICATIONS

Howard et al. "Practical Implementations of Arithmetic Coding." Image and Text Compression, 1992, pp. 85-112, Kluwer, Boston, US.

(Continued)

*Primary Examiner*—Doris H. To
*Assistant Examiner*—Ian N. Moore
(74) *Attorney, Agent, or Firm*—Swernofsky Law Group

(57) ABSTRACT

A technique is presented for compressing data which leverages the frequency of an escape symbol for better compression. The prefix of a data string is evaluated and the probability of all characters that might succeed it is predicted in tabular form. Symbols are designated "Hit" or "Miss" based upon whether they are in the table. A binary tree is generated by partitioning nodes into Zero and One groups based on a single bit value. A partition bit is chosen to maximize the difference of probability sums of Hit symbols in Zero and One groups, with exceptions for partitions having non Hit symbols in one of the groups. A probability value is assigned to each branch, based on the probabilities of Hit and Miss symbols. Encoding or decoding a symbol is facilitated by encoding or decoding the branch probabilities on the shortest path from the root to the leaf node containing the symbol using arithmetic encoding or decoding method.

14 Claims, 4 Drawing Sheets

U.S. PATENT DOCUMENTS

| | | | |
|---|---|---|---|
| 6,112,208 A * | 8/2000 | Ikegami | 707/101 |
| 6,401,188 B1 * | 6/2002 | Benayoun et al. | 711/217 |
| 6,535,150 B1 * | 3/2003 | Ross | 341/67 |
| 2002/0141422 A1 | 10/2002 | Hu | |
| 2003/0174077 A1 * | 9/2003 | Acharya et al. | 341/67 |
| 2003/0210164 A1 * | 11/2003 | Acharya et al. | 341/67 |

FOREIGN PATENT DOCUMENTS

| EP | 1 231 717 A2 | 8/2002 |
|---|---|---|

OTHER PUBLICATIONS

Isal et al. "Word-Based Block-Sorting Text Compression." Computer Science Conference, Proceedings of the 24th Australasian Gold Coast, pp. 92-99, Jan. 29-Feb. 4, 2001, IEEE Computing Society, Los Alamitos, CA, USA.

Klappenecker et al. "Lossless Compression of 3D MRI and CT Data." Proceedings of the SPIE, 1998, pp. 140-149, vol. 3458, SPIE, Bellingham, VA, US.

* cited by examiner

| PREFIX SYMBOLS 225 | SYMBOLS 260 | PROBABILITY VALUE 265 |
|---|---|---|
| THIS IS A NULL SET | A | 23% |
| | B | 22% |
| | C | 21% |
| | D | 20% |
| | E | 7% |
| | F | 4% |
| | G | 2% |
| | H | 1% |

EXAMPLE OF AN ORDER 0 TABLE 250

Fig 2A

| Prefix 215 | Symbol 220 | | Probability Value 225 | |
|---|---|---|---|---|
| A | A | | 65% | |
| | B | | 15% | |
| | C | | 10% | |
| | D | | 7% | |
| | ESC 221 | E | 3% | 0.75% |
| | | F | | 0.75% |
| | | G | | 0.75% |
| | | H | | 0.75% |
| B | A | | 45% | |
| | B | | 20% | |
| | C | | 14% | |
| | D | | 11% | |
| | ESC 221 | E | 10% | 2.5% |
| | | F | | 2.5% |
| | | G | | 2.5% |
| | | H | | 2.5% |

Example of an Order 1 table 210

| Prefix 235 | Symbol 240 | Probability value 245 |
|---|---|---|
| AB | C | 40% |
| | G | 20% |
| | E | 19% |
| | D | 11% |
| | ESC 241 (A, B, F, H) | 10% |
| BD | E | 35% |
| | B | 25% |
| | H | 18% |
| | D | 12% |
| | ESC 241 (A, C, F, G,) | 10% |

Example of an Order 2 table 230

BITWISE ADAPTIVE ENCODING USING PREFIX PREDICTION

BACKGROUND OF THE INVENTION

1. Field of the Invention

This invention relates to compression of data.

II. Related Art

It is highly desirable to compress data so that it can be efficiently stored and transmitted. Valuable bandwidth can be preserved and communication channels can be more efficiently used if the size of the data is reduced. Similarly, less memory is required to store compressed data than non-compressed data. Various different techniques such as run length encoding (for example, Ziv-Lempel and PK Zip), Huffman compression, and arithmetic coding can be used to compress data in such a way that data is not lost. These lossless techniques can be performed in conjunction with other algorithms that enhance compression, such as the Burrows-Wheeler transform.

A simple variant of run length encoding involves identifying one or more strings of data that are frequently repeated, such as the word "the". Such frequently repeated data strings can be encoded using a coding element that is substantially shorter than the string itself. This technique and variants thereof can achieve up to approximately 4:1 compression of English text. More complex variants of run length encoding are also in common use. A major drawback to run length encoding is that the strings of data that are frequently repeated are not always known a priori, thus requiring the use of a pre-determined set of codes for a set of predetermined repetitive symbols. It may not be possible to achieve the desired degree of compression if the repetitive strings in the data do not match those included in the pre-determined set.

Huffman coding or variants thereof, is used in a variety of instances, ranging from Morse code, to the UNIX pack/unpack and compress/uncompress commands. Huffman coding and variants of Huffman coding involve determining the relative frequency of characters and assigning a code based upon that particular frequency. Characters that recur frequently have shorter codes than characters that occur less frequently. Binary tree structures are generated, preferably starting at the bottom with the longest codes, and working to the top and ending with the shortest codes. Although preferably built from the bottom up, these trees are actually read from the top down, as the decoder takes a bit-encoded message and traces the branches of the tree downward. In this way, the most frequently encountered characters are encountered first. One of the drawbacks to Huffman coding is that the probabilities assigned to characters are not known a priori. Generally, the Huffman binary tree is generated using pre-established frequencies that may or may not apply to a particular data set.

Arithmetic coding is also used in a variety of circumstances. Generally, compression ratios achieved using arithmetic coding are higher than those achieved using Huffman coding when the probabilities of data elements are more arbitrary. Like Huffman coding, arithmetic encoding is a lossless technique based upon the probability of a data element. However, unlike Huffman coding, arithmetic coding produces a single symbol rather than several separate code words. Data is encoded as a real number in an interval from one to zero (as opposed to a whole number). Unfortunately, arithmetic coding presents a variety of drawbacks. First, arithmetic coding is generally much slower than other techniques. This is especially serious when arithmetic encoding is used in conjunction with high-order predictive coding methods. Second, because arithmetic coding more faithfully reflects the probability distribution used in an encoding process, inaccurate or incorrect modeling of the symbol probabilities may lead to poorer performances.

Adaptive statistics provides a technique for dealing with some of the drawbacks involving prior knowledge of a symbol set. In general, adaptive encoding algorithms provide a way to encode symbols that are not present in a table of symbols or a table of prefixes. If an unknown symbol is detected, an escape code (ESC value) is issued and entered into the coded stream. The encoder continues the encoding process with a lower order prefix, adding additional data to the encoded bit stream. The lowest order prediction table (often a order 0 table) must contain all possible symbols so that every possible symbol can be found in it. The ESC code must be encoded using a probability. However, because of the unpredictable nature of new symbols, the probability of the ESC code cannot be accurately estimated from preceding data. Often, the probability of the ESC value for a given prefix is empirically determined, leading to non-optimal efficiency. Thus, introduction of an ESC code in adaptive encoding algorithms raises two problems. Firstly, the ESC code only gives limited information about the new symbol; the new symbol still has to be encoded using a lower order of prefix prediction table. The second problem is that the probability of the ESC code can not be accurately modeled.

Accordingly, it would be advantageous to provide a technique for lossless compression that does not suffer from the drawbacks of the prior art.

SUMMARY OF THE INVENTION

The invention provides a technique for efficiently compressing data by reducing the effect of inaccurate modeling of the escape code (ESC) used in adaptive encoding algorithms so as to achieve a high degree of lossless compression.

In a first aspect of the invention, the prefix of a data string is evaluated and the probability of all characters that might succeed that prefix is predicted. A table comprised of all these probabilities is generated from the preceding data that has been encoded. In a preferred embodiment, the prefix may be comprised of one or two elements. Although the size of the prefix may be highly variable, the prefix is preferably an order 3 prefix or smaller so as to limit the number of values that will be recorded.

In a second aspect of the invention, a binary tree is constructed, using a principle called maximum disparity principle to be described below. Unlike binary trees used in Huffman coding, a tree called maximum disparity tree is generated so as to be as unbalanced as possible for the symbols found in the prediction table. For an L-bit representation $b_0 b_1 \ldots b_{L-1}$ of a select cluster of symbols, the maximum disparity tree may have up to L layers with each layer corresponding to a bit-based partition of the cluster of symbols. Let $P(b_0 b_1 \ldots b_{L-1})$ be the probability of a symbol $b_0 b_1 \ldots b_{L-1}$. For the kth bit $b_k$, we define the disparity $D_k$ as the absolute difference of the two probability sums of all symbols, one of which corresponds to $b_k=1$, the other $b_k=0$:

$$D_k = \left| \sum_{b_k=1} P(b_0 b_1 \ldots b_{L-1}) - \sum_{b_k=0} P(b_0 b_1 \ldots b_{L-1}) \right|$$

First the L disparity values $D_k$, k=0, 1, ... L–1, are computed and the maximum value DM is found. If there are more than one bits that attain the maximum value, choose any one of the bits as M. At the root (Layer 0) of the maximum disparity tree, the symbols are partitioned into two groups, the "Zero group" and the "One group". If a symbol has a 0 value at this M bit, then the symbol is put into the Zero group. If a symbol has a value of 1 at this M bit, then the symbols is put the One group. Each of the two branches of the tree is a sub-tree containing L–1 bits still unused in the partition process. The maximum disparity principle is applied recursively to each of the resulting sub-trees employing one of the unused bits as the partition bit until all bits have been used (or when the (L–1)th layer has been reached). The binary tree ends at leaves, each of which is a symbol.

The select cluster of symbols may or may not consist of all the symbols in a tree or sub-tree. In our preferred embodiment, the select cluster of symbols in a tree or sub-tree consist of first those which have known probabilities, called the HIT symbols. If there are no HIT symbols left or the probability sum of HIT symbols is zero, then the select cluster of symbols consist of those which have unknown (or uncertain) probabilities, called MISS symbols. The partition bit is chosen to maximize the disparity of probabilities of the select cluster. That is, disparity value $D_k$ is computed over HIT symbols first; if there are no HIT symbols left or the probability sum of HIT symbols is zero, then $D_k$ is computed over MISS symbols. However, those symbols with unknown probabilities, or the MISS symbols, are also partitioned into the Zero group or One group, base on their bit values at the partitioning bit.

For example, assume in a 3-bit representation $b_2 b_1 b_0$ of the symbols, $D_1 \geq D_0$, and $D_1 \geq D_2$. Then, the $b_1$ bit is used to do the Root (Layer 0) partition and all symbols of the form $b_2 0 b_0$ (like 101, 000) are put into the Zero group, and all symbols of the form $b_2 1 b_0$ (like 110, 011) are put into the One group, where X can be either 0 or 1. Now in the Zero group, bit 0 and bit 2 have not been used. We compute the disparity values $Z_2$ and $Z_0$ for bit 2 and bit 0 as $$Z_k = \left| \sum_{b_k=1} P(b_0 0 b_2) - \sum_{b_k=0} P(b_0 0 b_2) \right|$$

Assume $Z_2 \geq Z_0$, then we use bit 2 to partition the sub-tree corresponding the Zero group in Layer 1. Similarly, in the One group, bit 0 and bit 2 have also not been used. We compute the disparity values (again, using only HIT symbols) $O_2$ and $O_0$ for bit 2 and bit 0 as $$O_k = \left| \sum_{b_k=1} P(b_0 1 b_2) - \sum_{b_k=0} P(b_0 1 b_2) \right|$$

But in this group it is possible $O_0 \geq O_2$. If so, in the One group, we use bit 0 to partition the sub-tree corresponding the One group in Layer 1. In Layer 2, in each of the 4 resulting sub-trees, only one-bit is not used yet and that remaining unused bit in each sub-tree is used to partition the symbols in the sub-tree.

In a third aspect of the invention, it is possible to efficiently evaluate and encode symbols that do not appear in the probability table and are particularly difficult to efficiently compress using conventional compression techniques. For example, in Huffman coding, the frequency of these unknown symbols or escape values may be very high, thus requiring a short code (and thereby lengthening the code used for other known symbols). In a preferred embodiment, a symbol is encoded traversing the path from the root to the symbol in the associated binary tree. Unlike conventional approaches which encode a symbol in a single step, in the preferred embodiment, a symbol is encoded in several steps with each step corresponding to a layer in the binary tree. Effectively, a symbol is encoded bit by bit. This bitwise decomposition brings in two advantages. First, bitwise decomposition delays the use of the ESC value to a later time when there is less uncertainty about what the coming symbol will be. Second, it also traces the ESC value to the particular symbol that is escaped, eliminating the need of encoding the symbol again with a lower order prefix. The path encoded will lead to full discovery of the symbol as the binary tree must eventually end to a symbol along any path. Third, the probability of the ESC value is distributed over M-bits in an M-bit representation of symbols.

BRIEF DESCRIPTION OF THE DRAWINGS

FIG. 1 is a block diagram of an encoding system using prefix prediction.

FIGS. 2A and 2B are a block diagram of tables showing the probability of data elements in a sample prefix string.

DETAILED DESCRIPTION OF THE PREFERRED EMBODIMENT

In the following description, a preferred embodiment of the invention is described with regard to preferred process steps and data structures. Embodiments of the invention can be implemented using general purpose processors or special purpose processors operating under program control, or other circuits, adapted to particular process steps and data structures described herein. Implementation of the process steps and data structures described herein would not require undue experimentation or further investigation.

System Elements

Figures 1, 2B:
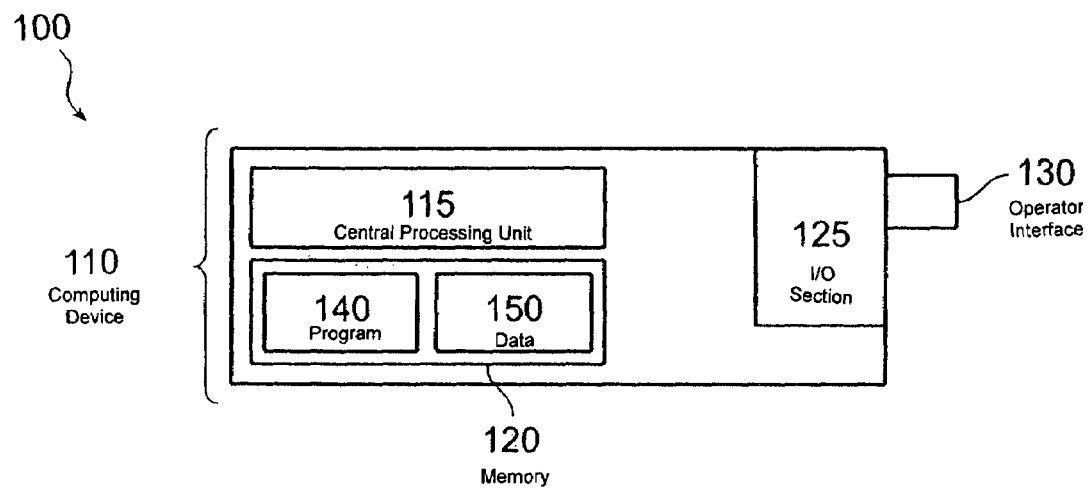

FIG. 1 is a block diagram of an encoding system with prefix prediction.

An encoding system using prefix prediction (indicated by general reference character 100) includes a computing device 110. The computing device 110 comprises a central processing unit 115, a memory 120, and an input/output (I.O.) section 125 coupled to an operator interface 130. The memory 120 can include any device for storing relatively large amounts of information, such as magnetic disks or tapes, optical devices, magneto-optical devices, or other types of mass storage. As used herein, the term "computing device" is intended in its broadest sense, and includes any device having a programmable processor or otherwise falling within the generalized Turing machine paradigm such as a personal computer, laptop or personal digital assistant.

The memory 120 includes a computer program 140 comprising a set of instructions 145 (not shown) for the following four-stage procedure: (1) ordering a set of data, (2) performing a Burrows Wheeler transform, (3) performing predictive prefix encoding, and (4) performing arithmetic encoding. In a preferred embodiment, the memory 120 also includes a set of data 150 that will be manipulated using the computer program 140.

FIGS. 2A and 2B are a block diagram of tables showing the probability of data elements that may follow a sample prefix string. For the purposes of illustration, a set of 8 symbols, {A,B,C,D,E,F,G,H} are considered as the full set of symbols.

Depending upon the nature of the data 150, the system 100 may generate either an order 1 table 210, an order 2 table 230, or an order 0 table 250 or all of them. Examples of these tables are shown in this figure. These tables and the symbols therein are exemplary and in no way limiting. In other preferred embodiments, other order tables, such as order 3 tables may also be generated.

The order 1 prediction table 210 includes a set of one or more prefix symbols 215, a set of one or more possible symbols 220 that may follow each prefix symbol 215, and a set of probability values 225. The prefix symbols 215 are those symbols that are identified as being at the very beginning of a particular ordered string. The set of symbols 220 include both actual characters and an ESC 221. The probability value 225 reflects the probability that a particular symbol 220 will follow the prefix symbol 215 in question. In an order 1 table 210, each prefix symbol 215 is limited to one character in length.

ESC is an escape value reflecting the collection of symbols not found in the current table. These "escaped" symbols are called Miss symbols. In contrast, those symbols found in the prediction table are called Hit symbols. In general, the probability of the ESC value is attributed to the collection of Miss symbols, but can hardly be accurately attributed to each particular symbol. However, ESC symbols in general will be further decomposed into symbols in the binary tree as discussed infra. In such cases, a shaped distribution of the ESC probability over all Miss symbols can be used. In table 210, a uniform distribution of the ESC probability over Miss symbols is used.

The order 2 prediction table 230 includes a set of one or more prefix symbols 235, a set of one or more possible symbols 240 that may follow the prefix symbols 235, and a probability value 245. The prefix symbols 235 are those symbols that are identified as those at the very beginning of a particular string. The set of symbols 240 include both Hit Symbols and an ESC 241. The ESC is an escape value reflecting the collection of Miss symbols in the current, order 2 table. The probability value 245 reflects the probability that a particular symbol 240 will follow the prefix symbol 235 in question. In an order 2 table 210, each prefix symbol 215 is two characters in length.

The order 0 prediction table 250 includes a null set of prefix symbols 255, a set of one or more symbols 260 that may follow the prefix symbols 255 and a probability value 265. Generally, the order 0 prediction table is applicable to the case when no prefix is used for encoding. The set of symbols 260 includes the full set of symbols and no ESC value, because the order 0 table contains all the possible symbols. The probability value 265 reflects the probability that a particular symbol 246 will follow the null prefix symbol 255 in question.

Figure 3:
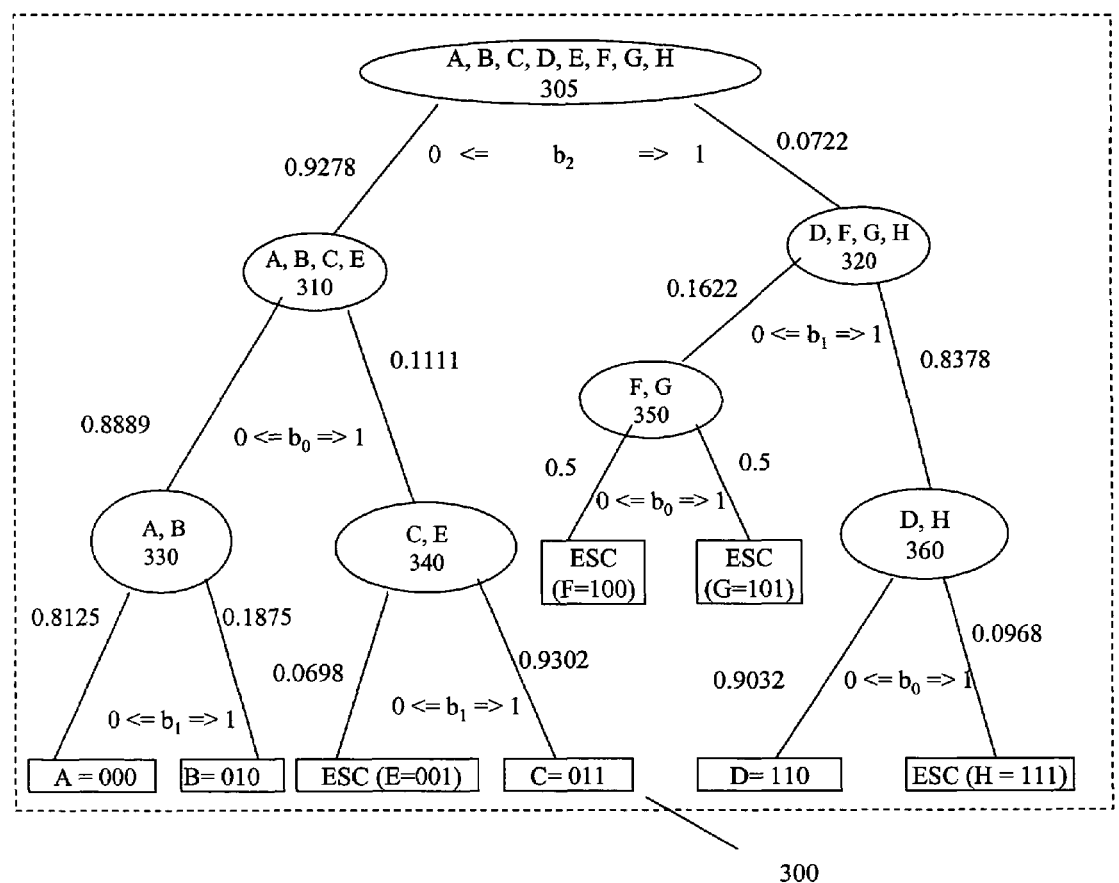
FIG. 3 is a data tree showing the distribution of probabilities in a sample prefix string.

FIG. 3 is a data tree showing the bit-wise encoding process of a symbol under a given prefix A. The symbols and values shown in this figure are exemplary and in no way limiting. This particular data tree is based upon values and symbols used in the order 1 table 210 shown in FIG. 2 that apply to a string beginning with the prefix 215 "A". Further, a symbol is represented by binary bits $b_2 b_1 b_0$ and the following binary representations for the symbol set {A, B, C, D, E, F, G, H} are assumed:

| Symbol | Value ($b_2\ b_1\ b_0$) |
|---|---|
| A | 000 |
| B | 010 |
| C | 011 |
| D | 110 |
| E | 001 |
| F | 100 |
| G | 101 |
| H | 111 |

This binary representation is exemplary and in no way limiting. Different trees may be obtained when the symbols are represented by other binary values.

The data tree 300 is a binary tree that is designed to be read from the top down. The root 305 contains the full set of symbols (all possible symbols in a given application). A fork node (such as 310, 320, 330, 340, 350, or 360) contains a subset of the symbols. The terminal nodes are called leaf nodes, each of which containing a single, different symbol from the full set of symbols. A branch to the left of a node is called a Zero group, and a group to the right is called a One group. A Zero group is associated with a branch marked by a 0 bit value. A One group is associated with a branch marked by a 1 bit value. Each branch is associated with a floating-point number which represents the probabilities of the symbols in the down-linked node, which is either a Zero group or a One group.

A binary data tree 300 is built in three steps:
1. A partition bit of maximum disparity value among the unused bits in the tree or sub-tree is chosen for each node, starting from the root node.
2. All symbols are partitioned (including Miss symbols) at each node into a Zero group and a One group. The partitioning is based on the value of a symbol at the partition bit chosen in step 1. Partitioning is performed bit wise, ending at the leaf nodes, at which point a single symbol is encoded.
3. For each branch in the tree, a probability containing the sum of the probabilities of all symbols in the branch is assigned.

A particular partition bit is chosen so as to maximize the imbalance of the probability sums of the Hit symbols (excluding the ESC symbols) in the resulting Zero and One groups. The partition bit must be one of the binary bits in the binary representation of the symbols. For example, in this figure, the partition bit must be either $b_2$, $b_1$, or $b_0$. If a bit has been used in a parent node, then it cannot be reused in the nodes downwards. If a partition bit leads to either a Zero or a One group that contains only Miss symbols, then the use of this bit should be delayed until all other remaining bits also lead to the same effect. If a node contains only a single Hit symbol, then the partition bit is chosen to maximize the probability sums of all symbols (including both Hit and Miss) in the group containing the Hit symbol. If a node contains no Hit symbol, then the partition bit is chosen to maximize the imbalance of the Miss symbols in the resulting Zero and One groups.

Partition of the symbols of a node into Zero and One is based on the value of a symbol at the chosen partition bit. Symbols with a 0 value at the partition bit are put into the Zero group and those with a 1 value at the partition bit are put into the One group. Hit symbols play a primary role in determining the partition bit for a given node. However, once the partition bit is chosen, all symbols in the node, (including Hit or Miss) are partitioned together using the same partition method.

After the partition process is completed, the final step of building the binary tree involves assigning a probability value to each branch in the tree. The probabilities of the left and right branches of each node must sum to 1. The probabilities for left and right branches of a node are assigned at the same time. The assignment is done in two steps. First, the probabilities of the Hit symbols is summed for the Zero group and One group respectively. The following example is for two sums, $Z_p$ and $O_p$. If one or both of $Z_p$ and $O_p$ are zero, then the $Z_p$ and $O_p$ are recomputed by summing the probabilities of all (Hit and Miss) symbols in the Zero and One groups respectively. The probability for the left branch is given by $Z_p/(Z_p+O_p)$; the probability for the right branch is given by $Z_p/(Z_p+O_p)$.

The binary data tree 300 is constructed using values and probabilities found in table 210. The root node 305 includes the full set of symbols (in this case, {A, B, C, D, E, F, G, H}), among which A, B, C, and D are Hit symbols and E, F, G, and H are Miss symbols. This full set of symbols is partitioned into Zero and One groups based on the value of $b_2$. The Zero group at node 310 includes A, B, C, and E because the $b_2$ bits of these symbols are 0. The One group at node 320 includes D, F, G, and H because the $b_2$ bits of these symbols are 1. $b_2$ is chosen for the first partition is because the resulting probability sum $Z_p$ of Hit symbols (A, B, C) in the Zero group is 0.9 and the probability sum $O_p$ of Hit symbols (D) in the One group is 0.07. This is the most unbalanced result, given that $b_1$ leads to a partition of 0.65 (A, E, F, G for Zero group) and 0.32 (B, C, D, H for One group), and $b_0$ leads to a partition of 0.87 (A, B, D, F for Zero group) and 0.10 (C, E, G, H for One group). Moving down the tree, node 310 is partitioned with the $b_0$ bit. Node 320 can be partitioned at either $b_1$ or $b_0$ because the resulting trees have the same probability values. The $b_1$ bit leads to a Zero group including only Miss symbols (F and G), while $b_0$ bit leads to a One group including only Miss symbols (G and H). To avoid ambiguity, the bit with the higher position (i.e., on the left), is chosen.

The branching probabilities in binary tree 300 are obtained as follows. The Zero group of Node 305 is node 310. This node 310 includes A, B, and C as Hit symbols. The One group of Node 305 is node 320. The only Hit symbol in Node 320 is D. Probability values for these node are found in Table 210. The probability sum $Z_p$ of the Hit symbols in the Zero group at node 310 is 0.65+0.15+0.1 (the probability of A, B and C is 0.65, 0.15, and 0.1, respectively). The probability sum $O_p$ of the Hit symbols in the One group at Node 320 is 0.07, given that D has a probability of 0.07. Therefore, the left branch of Node 305 has a probability of $Z_p/(Z_p+O_p)=0.9278$, and the right branch has a probability of $O_p/(Z_p+O_p)=0.0722$.

Node 360 is a One group of node 320. When Node 360 is partitioned at $b_0$, the resulting One group includes a single Miss symbol (H). Therefore, in calculating the probability sums, both Miss and Hit symbols are used. In this case, $Z_p=0.07$ and $O_p=0.0075$, leading to a probability of 0.9032 for left branch and a probability of 0.0968 for right branch probability. Other nodes are handled similarly.

Encoding a symbol X under a given prefix is done in three steps:

1. Build the binary tree based on the prediction table of the given prefix.

2. Identify the path from the root to the symbol X.
3. Encode each of the probabilities on the path.

For example, in this figure, symbol D is encoded with three probabilities 0.0722, 0.8378, and 0.9032, while E is encoded with 0.9278, 0.1111, and 0.0698. Each probability value is encoded using standard arithmetic encoding method.

Method of Use

Figure 4:
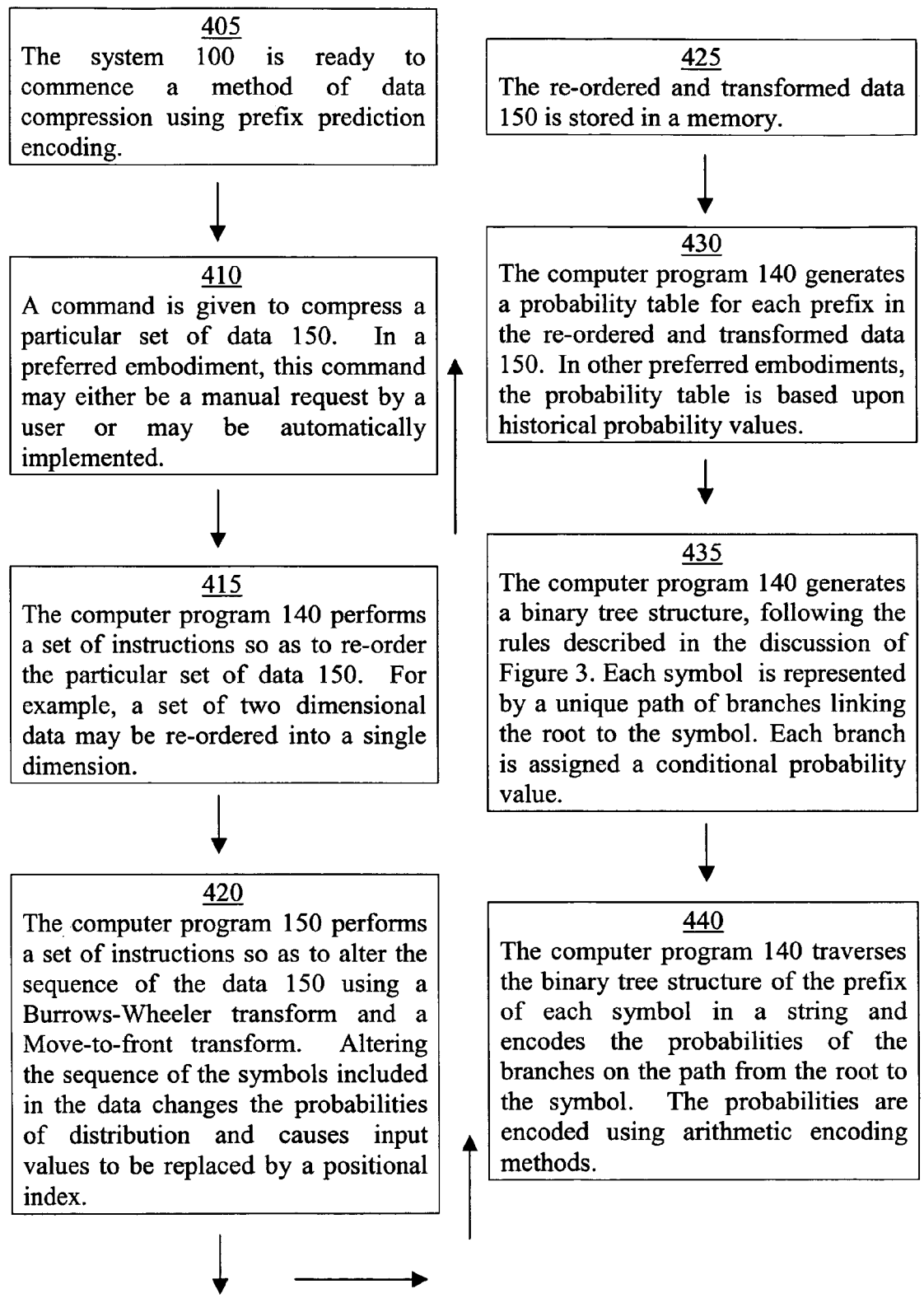
FIG. 4 is a flow diagram showing a method of data compression using prefix prediction encoding.

FIG. 4 is a flow diagram showing a method of data compression using prefix prediction encoding.

The method 400 is performed by a system 100. Although the method 400 is described serially, the steps of the method 400 can be performed by separate elements in conjunction or in parallel, whether asynchronously, in a pipelined manner, or otherwise.

At a flow point 405, the system 100 is ready to commence a method of data compression using prefix prediction encoding.

In a step 410, a command is given to compress a particular set of data 150. In a preferred embodiment, this command may either be a manual request by a user or may be automatically implemented.

In a step 415, the computer program 140 performs a set of instructions so as to re-order the particular set of data 150. For example, a set of two dimensional data may be re-ordered into a single dimension.

In a step 420, the computer program 150 performs a set of instructions so as to alter the sequence of the data 150 using a Burrows-Wheeler transform and a Move-to-front transform. Altering the sequence of the symbols included in the data changes the probabilities of distribution and causes input values to be replaced by a positional index.

In a step 425, the re-ordered and transformed data 150 is stored in a memory.

In a step 430, the computer program 140 generates prediction probability tables for each symbol in the re-ordered and transformed data 150. The tables are conditioned upon the prefixes of the symbol. In other preferred embodiments, the probability tables are based upon historical probability values.

In a step 435, the computer program 140 generates a binary tree structure, in such a way as to maximize the imbalance of the probability sums of the Hit symbols (excluding the Miss symbols) in each pair of the Zero and One groups, as shown in FIG. 3. Each symbol is represented by a unique path connecting the root to the symbol. The path consists of branches, each of which is assigned a conditional probability value. Encoding a symbol is done by encoding the probability values on the path from the root to the symbol.

In a step 440, the computer program 140 traverses the binary tree structure of the prefix of a symbol to be encoded and encodes the probabilities on the path from the root of the tree to the symbol. In preferred embodiments, the probability values are encoded using the arithmetic encoding method. This step may occur multiple times, with different prefixes and different strings until an entire data set is encoded.

ALTERNATE EMBODIMENTS

Although preferred embodiments are disclosed herein, many variations are possible which remain within the concept, scope, and spirit of the invention, and these variations would become clear to those skilled in the art after perusal of this application.

The invention claimed is:

1. A method of encoding symbols, including
ordering a set of symbols in a string, wherein said step of ordering includes performing one or more of a Burrows-Wheeler transform and a move-to-front transform;
associating each symbol included in said set of symbols with a context, said context including a prefix;
generating a prediction table for said prefix that is responsive to said set of symbols;
generating a tree responsive to said prediction table, wherein said tree includes a set of nodes, used in the bitwise encoding of said set of symbols;
selecting a partition bit associated with a select node included in said set of nodes, wherein said partition bit corresponds to a digit in a binary representation of said set of symbols;
partitioning said set of symbols present at said select node based upon a value of said selected partition bit into two down-linked nodes, starting from a root node including said set of symbols with their probabilities and ending with a leaf node, wherein said leaf node includes a single symbol and a probability responsive to said symbol, wherein said down-linked nodes, said root node and said one or more leaf nodes are included in said set of nodes and said single symbol is included in said set of symbols;
assigning a probability for each branch in said tree, wherein
said probability for a branch that corresponds to Zero group from a node with at least one Hit symbol in the Zero group and at least one Hit symbol in One group is equal to a sum of probabilities of Hit symbols in the Zero group,
said probability for a branch that corresponds to the One group from a node with at least one Hit symbol in the Zero group and at least one Hit symbol in the One group is equal to a sum of probabilities of Hit symbols in the One group,
said probability for a branch that corresponds to the Zero group from a node in which at least one of the Zero group and the One group is without any Hit symbols is equal to a sum of probabilities of all symbols in the Zero group, and
said probability for a branch that corresponds to the One group from a node in which at least one of the One group and the Zero group is without any Hit symbols is equal to a sum of probabilities of all symbols in the One group; and
encoding said symbols such that said step of encoding is responsive to the probabilities on said branches that form the path from said root node to said node associated with said symbol;
wherein said encoding provides a lossless compression of said symbols for efficient storage and transmission.

2. A method of claim 1, wherein said step of generating a prediction table includes generating one or more of the following: an order 0 table, and order 1 table, an order 2 table, and an order 3 table.

3. A method of claim 1, wherein said prediction table expresses known probabilities of said symbols; and an escape value, wherein said escape value corresponds to the collective probability of a subset of symbols, the individual probabilities of which are unknown, inaccurate, or artificially assigned.

4. A method of claim 1, wherein said step of selecting a partition bit includes determining a relative probability disparity with respect to said symbols of known probabilities and to said symbols of unknown, inaccurate, or artificially assigned probabilities, wherein said symbols of known probability have a higher priority.

5. A method of claim 1, wherein said set of nodes includes root nodes, fork nodes and terminal leaf nodes.

6. A method of claim 5, wherein one or more said terminal leaves is associated with a symbol whose probability value is known from a priori knowledge or preceding statistics, or unknown but modeled by some formula.

7. A computer readable medium encoded with instructions, said instructions executable by a processor, said instructions for encoding symbols including
ordering a set of symbols in a string, wherein said step of ordering includes performing one or more of a Burrows-Wheeler transform and a Move-to-front transform;
associating each symbol included in said set of symbols with a context, said context including a prefix;
generating a prediction table for said prefix that is responsive to said set of symbols;
generating a tree responsive to said prediction table, wherein said tree includes a set of nodes, used in the bitwise encoding of said set of symbols;
selecting a partition bit associated with select nodes included in said set of nodes, wherein said partition bit corresponds to a location of a particular bit in a binary representation of said set of symbols;
partitioning said set of symbols responsive to said value of said selected partition bit into two down-linked nodes, starting from a root node including said set of symbols and ending at a leaf node, wherein said leaf node includes a single symbol and a probability responsive to said single symbol, and wherein down-linked nodes, said leaf nodes and said root nodes are included in said set of nodes and said single symbol is included in said set of symbols;
assigning a probability for each branch in said tree, wherein
said probability for a branch that corresponds to Zero group from a node with at least one Hit symbol in the Zero group and at least one Hit symbol in One group is equal to a sum of probabilities of Hit symbols in the Zero group,
said probability for a branch that corresponds to the One group from a node with at least one Hit symbol in the Zero group and at least one Hit symbol in the One group is equal to a sum of probabilities of Hit symbols in the One group,
said probability for a branch that corresponds to the Zero group from a node in which at least one of the Zero group and the One group is without any Hit symbols is equal to a sum of probabilities of all symbols in the Zero group, and
said probability for a branch that corresponds to the One group from a node in which at least one of the One group and the Zero group is without any Hit symbols is equal to a sum of probabilities of all symbols in the One group; and
encoding said symbols such that said step of encoding is responsive to the probabilities on the branches that form the path from said root node to said node associated with said symbol,
wherein said encoding provides a lossless compression of said symbols for efficient storage and transmission.

8. A memory storing information, wherein said step of generating a prediction table includes generating one or more of the following: an order 0 table, and order 1 table, an order 2 table, and an order 3 table.

9. A memory storing information as in claim 7, wherein said prediction table expresses known probabilities of said symbols, and an escape value, wherein said escape value corresponds to the collective probability of a subset of symbols, the individual probabilities of which are unknown, inaccurate, or artificially assigned.

10. An apparatus for encoding symbols, including
a means for ordering a set of symbols in a string, wherein said means for ordering includes a means for performing one or more of a Burrows-Wheeler transform and a move-to-front transform;
a means for associating a symbol included in said set of symbols with a context, said context including a prefix;
a means for generating a prediction table for said prefix that is responsive to said set of symbols;
a means for generating a tree responsive to said prediction table, wherein said tree includes a set of nodes, used in the bitwise encoding of said set of symbols;
a means for selecting a partition bit associated with a select node in said set of nodes, wherein said partition bit corresponds to a location of a particular bit in a binary representation of said set of symbols;
a means for partitioning said set of symbols present at said nodes based upon the value of said selected partition bit into two down-linked nodes, starting from a root node including said set of symbols and ending at a leaf node associated with a single symbol, wherein said down-linked nodes, said leaf node and said root node are included in said set of nodes and said single symbol is included in said set of symbols;
a means for assigning a probability to each branch in said tree structure, wherein
said probability for a branch that corresponds to Zero group from a node with at least one Hit symbol in the Zero group and at least one Hit symbol in One group is equal to a sum of probabilities of Hit symbols in the Zero group,
said probability for a branch that corresponds to the One group from a node with at least one Hit symbol in the Zero group and at least one Hit symbol in the One group is equal to a sum of probabilities of Hit symbols in the One group,
said probability for a branch that corresponds to the Zero group from a node in which at least one of the One group and the Zero group is without any Hit symbols is equal to a sum of probabilities of all symbols in the Zero group, and
said probability for a branch that corresponds to the One group from a node in which at least one of the Zero group and the One group is without any Hit symbols is equal to a sum of probabilities of all symbols in the One group; and
a means for encoding said symbol such that said step of encoding is responsive to the probabilities on said branches that form the path from said root to a said leaf including said single symbol;
wherein said encoding provides a lossless compression of said symbols for efficient storage and transmission.

11. The apparatus of claim 10, wherein said means for generating a prediction table includes a means for generating one or more of the following: an order 0 table, and order 1 table, an order 2 table, and an order 3 table.

12. The apparatus of claim 10, wherein said prediction table expresses known probabilities of said symbols, and an escape value, wherein said escape value corresponds to the collective probability of a subset of symbols, the individual probabilities of which are unknown, inaccurate, or artificially assigned.

13. A method of claim 1, including performing said method to decode a set of encoded symbols.

14. A memory storing information as in claim 7, including performing said method to decode a set of encoded symbols.

* * * * *